United States Patent
Jeng et al.

(10) Patent No.: US 10,075,667 B2
(45) Date of Patent: Sep. 11, 2018

(54) SIGNAL RECEIVING END OF DIGITAL TELEVISION AND SIGNAL PROCESSING METHOD THEREOF

(71) Applicant: MStar Semiconductor, Inc., Hsinchu, Hsien (TW)

(72) Inventors: You-Tsai Jeng, Hsinchu County (TW); Tai-Lai Tung, Hsinchu County (TW); keng-Lon Lei, Hsinchu County (TW); Kuo-Yu Lee, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 73 days.

(21) Appl. No.: 15/380,055

(22) Filed: Dec. 15, 2016

(65) Prior Publication Data

US 2017/0295342 A1    Oct. 12, 2017

(30) Foreign Application Priority Data

Apr. 7, 2016   (TW) .............................. 105110971 A

(51) Int. Cl.
  *H04N 5/52*   (2006.01)
  *H03G 3/30*   (2006.01)
  (Continued)

(52) U.S. Cl.
  CPC ............. *H04N 5/52* (2013.01); *H03G 3/3005* (2013.01); *H03G 3/3089* (2013.01); *H04N 5/21* (2013.01);
  (Continued)

(58) Field of Classification Search
  CPC .. H04N 5/22; H04N 5/21; H04N 5/52; H03M 1/18; H03M 1/181; H03M 1/182; H03M 1/183; H03M 1/185; H03M 1/186; H03M 1/187; H03M 1/188
  USPC ....... 348/572, 534, 532, 528, 618, 647, 666, 348/678, 706, 710, 714, 719, 725, 730, 348/731, 735, 835, 21, 229.1, 255, 342, 348/361, 470; 375/224, 261, 316, 345, (Continued)

(56) References Cited

U.S. PATENT DOCUMENTS 4,885,785 A  *  12/1989  Reynolds ............... B41F 13/025
                                              101/226
5,930,310 A  *  7/1999   Freeman .................. H04B 3/30
                                              329/318

(Continued)

FOREIGN PATENT DOCUMENTS

TW       200704069       1/2007
TW       201123875       7/2011

*Primary Examiner* — Paulos M Natnael
(74) *Attorney, Agent, or Firm* — WPAT, PC

(57) ABSTRACT

A signal receiving end of a digital television includes: an analog-to-digital converter (ADC), converting an input signal from an analog format to a digital format, the input signal including a target signal and an interference signal; a digital gain control circuit, coupled to the ADC, adjusting an amplitude of the target signal according to a gain; a detecting module, coupled to the digital gain control circuit, detecting a variance in the gain to generate a detection value; and a control circuit, coupled to the digital gain control circuit, determining a gain setting parameter according to the detection value. Wherein, the digital gain control circuit further updates the gain according to the gain setting parameter.

14 Claims, 3 Drawing Sheets

(51) Int. Cl.
  *H04N 5/21*   (2006.01)
  *H04R 3/04*   (2006.01)
  *H04R 3/00*   (2006.01)

(52) U.S. Cl.
  CPC ............... *H04R 3/00* (2013.01); *H04R 3/04*
       (2013.01); *H04R 2430/01* (2013.01); *H04R*
       *2499/15* (2013.01)

(58) Field of Classification Search
  USPC ........... 375/346, 347; 455/63.1, 130, 232.1,
             455/234.1, 245.1, 250.1; 341/139, 155
  See application file for complete search history.

(56) References Cited

U.S. PATENT DOCUMENTS

| | | | | |
|---|---|---|---|---|
| 6,321,073 | B1* | 11/2001 | Luz | H03G 3/3068 330/278 |
| 7,046,749 | B2* | 5/2006 | Takatz | H03G 3/3052 375/316 |
| 7,787,848 | B2* | 8/2010 | Lin | H03G 3/3068 455/234.1 |
| 8,843,094 | B2* | 9/2014 | Ahmed | H04W 52/245 455/226.2 |
| 9,143,286 | B2* | 9/2015 | Li | H04L 1/206 |
| 9,496,881 | B2* | 11/2016 | Zhao | H03G 3/20 |
| 2002/0131533 | A1* | 9/2002 | Koizumi | H04L 27/3809 375/345 |
| 2003/0162518 | A1* | 8/2003 | Baldwin | H04B 1/28 455/253.2 |
| 2007/0291880 | A1* | 12/2007 | Ashkenazi | H03G 3/3068 375/345 |
| 2008/0069191 | A1* | 3/2008 | Dong | H04L 25/03178 375/219 |
| 2009/0074042 | A1* | 3/2009 | Lin | H04L 27/2647 375/224 |
| 2009/0075614 | A1* | 3/2009 | Lin | H03G 3/3068 455/240.1 |
| 2009/0079611 | A1* | 3/2009 | Hwang | H03M 1/18 341/155 |
| 2009/0141998 | A1* | 6/2009 | Kubo | G06T 5/002 382/264 |
| 2010/0238358 | A1* | 9/2010 | Ma | H04B 1/1027 348/725 |
| 2010/0279744 | A1* | 11/2010 | Landmark | H04W 52/0251 455/574 |
| 2011/0150152 | A1* | 6/2011 | Challa | H03G 3/3078 375/345 |
| 2012/0045123 | A1* | 2/2012 | Hsieh | G06T 5/002 382/167 |
| 2014/0173668 | A1* | 6/2014 | Tseng | H04N 5/50 725/67 |
| 2014/0340153 | A1* | 11/2014 | Wilhelmsson | H03G 3/3078 330/278 |
| 2016/0216794 | A1* | 7/2016 | Yoon | G06F 3/041 |
| 2016/0226500 | A1* | 8/2016 | Zhao | H03G 3/20 |
| 2017/0366279 | A1* | 12/2017 | Nakanishi | H04B 15/04 |

* cited by examiner

SIGNAL RECEIVING END OF DIGITAL TELEVISION AND SIGNAL PROCESSING METHOD THEREOF

This application claims the benefit of Taiwan application Serial No. 105110971, filed Apr. 7, 2016, the subject matter of which is incorporated herein by reference.

BACKGROUND OF THE INVENTION

Field of the Invention

The invention relates in general to digital auto gain control (DAGC), and more particularly to DAGC that adaptively adjusts a gain step size.

Description of the Related Art

When a target signal is transmitted in a channel, it sometimes encounters influences from adjacent channels—such influences are referred to as adjacent channel interference (ACI). For example, a signal is usually processed by an auto gain control (AGC) to adjust the amplitude (i.e., the energy value) of the signal before it enters an analog-to-digital converter (ADC), so as to prevent an excessively large amplitude of the signal from saturating the ADC or an inadequately small amplitude of the signal from causing an insufficient data size. When the amplitude of a signal from an adjacent channel of a target signal is excessively larger than that of the target signal, an AGC circuit adjusts the target signal and the signal from the adjacent channel using a smaller gain, in a way that the amplitude of the target signal may be adjusted to an inadequately small value by the AGC circuit. In the above situation, the target signal having been processed by the ADC needs to be again adjusted by AGC in order to achieve an appropriate amplitude for further processes of backend circuits. In a conventional approach, a digital auto gain control (DAGC) circuit adjusts the gain using a constant step size. However, one drawback of such approach is that, in an environment where the ACI is sometimes drastic (fast changing with large variations) and sometimes moderate (slow changing with small variations), the DAGC circuit may fail to immediately adjust the amplitude of the target signal based on current environment conditions, hence affecting the operation performance of a circuit.

SUMMARY OF THE INVENTION

It is an object of the present invention to provide a signal receiving end of a digital television and a signal processing method thereof to adaptively adjust a gain according to adjacent channel interference (ACI).

The present invention discloses a signal receiving end of a digital television. The signal receiving end includes: an analog-to-digital converter (ADC), converting an input signal from an analog format to a digital format, the input signal including a target signal and an interference signal; a digital gain control circuit, coupled to the ADC, adjusting an amplitude of the target signal according to a gain; a detecting module, coupled to the digital gain control circuit, detecting a variance of the gain to generate a detection value; and a control circuit, coupled to the digital gain control circuit, determining a gain setting parameter according to the detection value. Wherein, the digital gain control circuit further updates the gain according to the gain setting parameter.

The present invention further discloses a signal processing method for a digital television receiving end. The signal processing method includes: converting an input signal from an analog format to a digital format, the input signal including a target signal and an interference signal; adjusting an amplitude of the target signal according to a gain; detecting a variance of the gain to generate a detection value; determining a gain setting parameter according to the detection value; and updating the gain according to the gain setting parameter.

The signal receiving end of a digital television and the signal processing method of the present invention are capable of adaptively adjusting the gain according to ACI, such that a television system may be adaptively adjusted in response to changes in the ACI to further enhance overall performance. As opposed to a conventional solution, the gain provided by the present invention is capable of immediately reflecting the change in the ACI, i.e., the system performs signal processing with consideration of current channel environment conditions.

The above and other aspects of the invention will become better understood with regard to the following detailed description of the preferred but non-limiting embodiments. The following description is made with reference to the accompanying drawings.

DETAILED DESCRIPTION OF THE INVENTION

The disclosure of the application includes a signal receiving end of a digital television and a signal processing method thereof. In possible implementation, one skilled person in the art may choose equivalent elements or steps to implement the present invention based on the disclosure of the application. That is, the implementation of the present invention is not limited by the non-limiting embodiments below.

Figure 1:
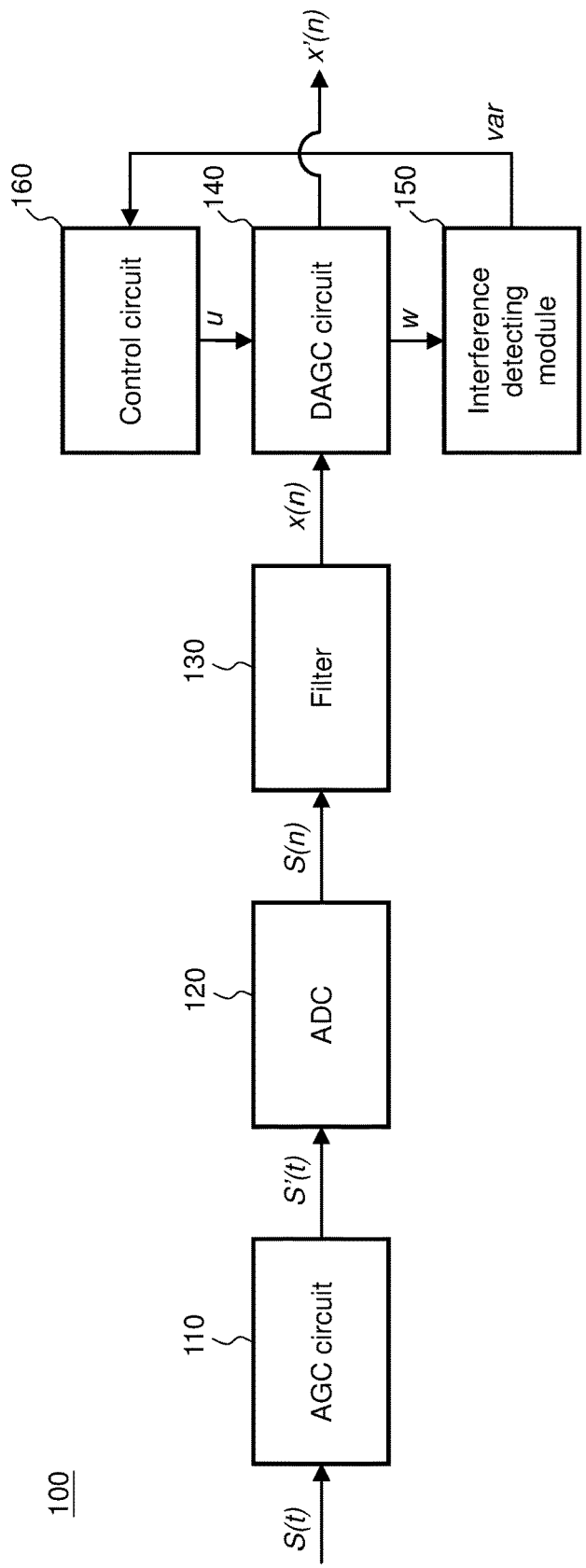
FIG. 1 is a function block diagram of a signal receiving end of a digital television according to an embodiment of the present invention.

FIG. 1 shows a function block diagram of a signal receiving end of a digital television according to an embodiment of the present invention. For example, the signal receiving end 100 of a digital television is a Digital Terrestrial Multimedia Broadcast (DTMB) television receiving end, and may include an auto gain control (AGC) circuit 110, an analog-to-digital converter (ADC) 120, a filter 130, a digital auto gain control (DAGC) circuit 140, an interference detecting circuit 150 and a control circuit 160. The AGC circuit 110 receives an analog input signal S(t) (where t is a time parameter of continuous time) and adjusts the amplitude of the input signal S(t). The ADC 120 converts an input signal S'(t) with the adjusted amplitude to an input signal S(n) in a digital format (where n is a time parameter of discrete time). The input signal S(n) at least includes a target signal x(n) carrying audiovisual data. The filter 130 filters out the adjacent channel interference (ACI) from the input signal S(n) to keep the target signal x(n). More specifically, the filter 130 is in fact a band-pass filter for filtering out components that are not the target signal x(n) from the input signal. In another embodiment, the filter 130 may also be a low-pass filter or a high-pass filter. The DAGC circuit 140 again adjusts the amplitude of the target signal x(n) (i.e., a range in a binary value that the target signal x(n) is distributed in the digital domain), so that a backend circuit (e.g., a demodulation circuit, not shown) may process an adjusted target signal x'(n) having a better amplitude.

The DAGC circuit 140 multiplies the target signal x(n) by a gain w to adjust the gain of the amplitude of the target signal. In one embodiment, the gain w used by the DAGC circuit 140 may be obtained based on an algorithm below:

$$x'(n) = w(n) \cdot x(n) \tag{1}$$

$$w(n+1) = w(n) + u \cdot e(n) \cdot x(n) \tag{2}$$

$$e(n) = y(n) - x'(n) \tag{3}$$

In the equations above, u is a step size and is a gain setting parameter, and e(n) is a difference between an adjusted target signal (w(n)·x(n)) and an ideal value y(n). According to equations (1) to (3), as the difference e(n) after an $n^{th}$ adjustment gets larger or the amplitude of the adjusted target signal gets larger, the $(n+1)^{th}$ gain w also becomes greater. However, equations (1) to (3) are examples in one embodiment, and are not to be construed as limitations to the present invention. Given that the purpose of a next gain w becomes greater as the difference gets larger or the amplitude of the signal gets larger, modifications and variations made are to be encompassed within the scope of the present invention. It should be noted that, the signal in this embodiment is in a real number, and so equation (2) is used to calculate the gain w. If the signal is in a complex number, equation (2) is replaced by equation (4) below:

$$w(n+1) = w(n) + u \cdot e(n) \cdot x(n)' \tag{4}$$

Further, as changes in the ACI may sometimes be drastic and sometimes be moderate, the gain w needs to be provided with a faster adjustment speed in response to the drastic changes and be maintained stable in response to the moderate changes. As such, issues of the DAGC circuit 140 failing to immediately adjust the amplitude of the adjusted target signal x'(n) to an ideal value when there are drastic changes in the ACI, or an unstable adjusted signal caused by excessively large changes in the adjusted target signal x'(n) when the changes in the ACI are moderate, can be prevented.

To achieve the above object, the signal receiving end 100 of a digital television further includes an interference detecting module 150 for detecting the ACI. The interference detecting module 150 is coupled to the AGC circuit 140, and generates a detection value var according to the change in the gain w. As previously described, in the presence of a large ACI, the AGC circuit 110 reduces the amplitude of the input signal S(t) to prevent the ADC 120 from saturating. At this point, the backend DAGC circuit 140 needs to increase the target signal x(n) using a relatively larger gain w. Conversely, in the presence of a small ACI, the DAGC circuit 140 uses a smaller gain w. That is to say, the gain w and the size of the ACI are positively correlated, and so the change in the ACI may be learned by analyzing the gain w. In one embodiment, the interference detecting module 150 calculates the variance of the gain w to obtain the detection value var of the ACI. With information associated with the ACI available, the information may be used to adjust the gain w of the DAGC circuit 140, which may then immediately adjust the gain w to reflect the ACI in the channel.

The signal receiving end 100 of a digital television further includes the control circuit 160 coupled to the DAGC circuit 140 and the interference detecting module 150. The control circuit 160 generates the step size u that the DAGC circuit 140 needs according to the detection value var. For example, the control circuit 160 is a central processing unit (CPU), a microcontroller or a microprocessor in a digital television system corresponding to the signal receiving end 100 of a digital television, and calculates the step size u according to equations below:

$$u = b[1 - \exp(-\text{var}')] \tag{5}$$

$$\text{var}' = a \times (\text{var}/N)^r \tag{6}$$

In the equations above, the values a, b, N and r may be set based on requirements of the transmission environment of the signal and/or the digital television system. Next, the control circuit 160 outputs the calculated step size u to the DAGC circuit 140, which then obtains the gain w that reflects the level of the ACI according to equation (2). Equations (5) and (6) are examples in one embodiment of the present invention, and are not to be construed as limitations to the present invention. Given that a larger step size u can be dynamically provided in response to a larger detection value var of the ACI and a smaller step size u can be provided in response to a smaller detection value var of the ACI, any modifications and variations made are to be encompassed within the scope of the present invention.

It should be noted that, in one embedment, the interference detecting module 150 is implemented by hardware to achieve a benefit of having a fast computing speed. In other embodiments, the interference detecting module 150 may be implemented by software and/or firmware to achieve benefits of reducing the circuit area and enhancing flexibilities in parameter setting. When implemented by software and/or firmware, the interference detecting module 150 is stored in form of a program code in a system memory (not shown) of the digital television system, and the program code may be accessed from the memory and executed by the control circuit 160. Thus, when the interference detecting module 150 is implemented by software and/or firmware, it may be regarded as a function module that the control circuit 160 applies to detect the ACI, and the control circuit 160 executes the program code to perform the function of the function module.

Figure 2:
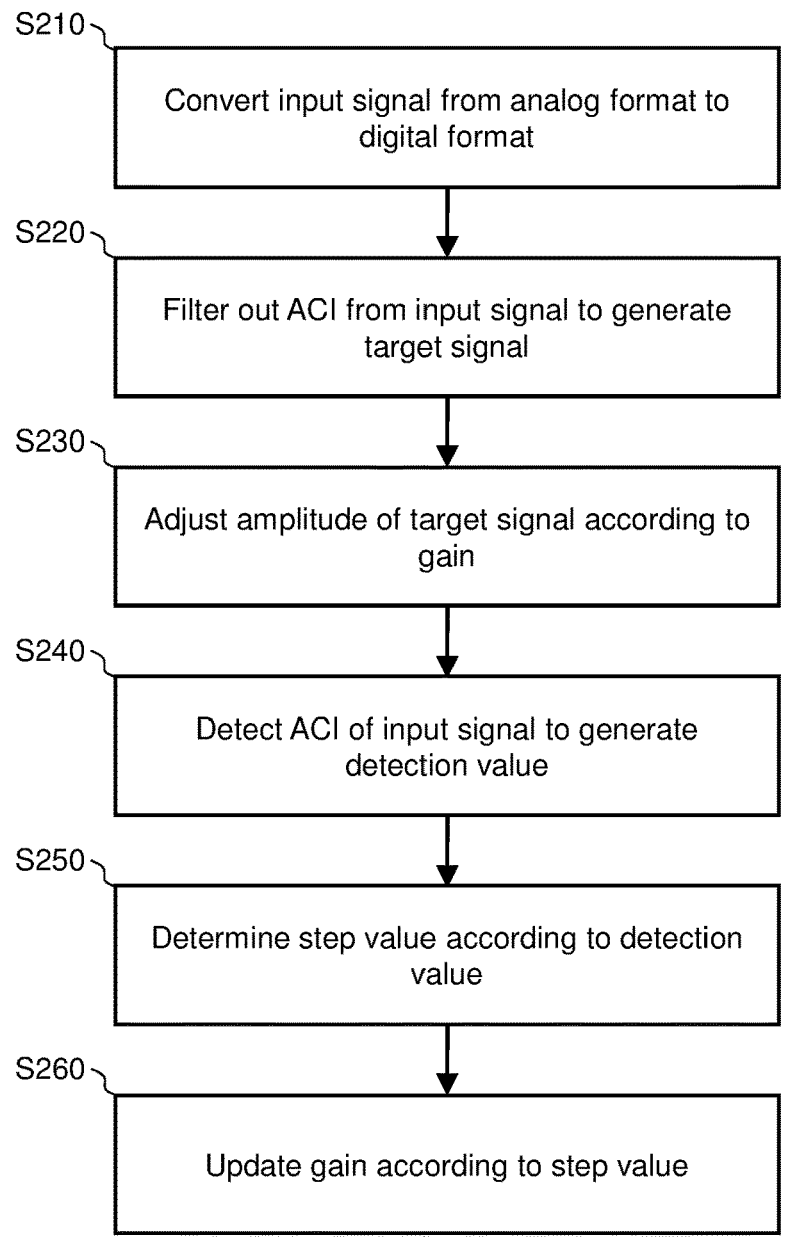
FIG. 2 is a flowchart of a signal processing method for a signal receiving end of a digital television according to an embodiment of the present invention.

FIG. 2 shows a flowchart of a signal processing method for a digital television receiving end according to an embodiment of the present invention. In addition to the signal receiving end 100 of a digital television, the present invention correspondingly discloses a signal processing method for a digital television receiving end. The method is performed by the foregoing signal receiving end 100 of a digital television or an equivalent device, and includes following steps.

In step S210, an input signal is converted from an analog format to a digital format. Due to limitations of an ADC, the input signal needs to be first processed by an auto gain control (AGC) circuit to adjust the amplitude of the input signal to prevent the ADC from saturating. However, when the amplitude of adjacent channel interference (ACI) in the input signal is excessively large, a target signal that is included in the input signal, after having been processed by the AGC circuit, may have an amplitude that is too small that disfavors operations of backend circuits.

In step S220, the ACI is filtered out from the input signal to generate a target signal. This step may be performed by a band-pass filter, a low-pass filter or a high-pass filter to filter out components of the ACI from the input signal to leave only the target signal.

In step S230, the amplitude of the target signal is adjusted according to a gain, such that the adjusted target signal has an more appropriate amplitude favorable for processes of backend circuits.

In step S240, the ACI of the input signal is detected to generate a detection value. To have a step size reflect the change in the ACI, this step first detects the ACI to generate the detection value. As previously described, the size of the gain for adjusting the target signal in step S240 is positively correlated with the size of the ACI. Thus, in one embodiment, this step may obtain the detection value through calculating the variance of the gain value, and so the detection value obtained reflects the change in the ACI.

In step S250, a step value is determined according to the detection value. With the detection value that reflects the change in the ACI, the step value used in step S230 may be adjusted according to the detection value (e.g., equations (5) and (6)), which indirectly correspondingly adjusts the gain along with the change in the ACI. That is to say, the step value in equation (2) is dynamically adjusted in response to the ACI instead of being a constant value.

In step S260, the gain is updated according to the step value. A target signal having an inadequately amplitude may be multiplied by the gain in the digital domain to become amplified. In one embodiment, the gain is as shown in equations (1) to (3), for example.

Steps S210 to S260 are repeatedly performed to process more input signals. Because the size of the gain is substantially associated with the ACI, the present invention is capable of more adaptively adjusting the amplitude of the target signal. That is to say, when the ACI changes drastically, the detection value generated in step S240 is larger to further provide a greater step value in step S250, and the updated gain in step S260 is allowed to immediately reflect the actual changes in the transmission channel. Conversely, when the ACI changes moderately, the detection value generated in step S240 is smaller to further provide a smaller step value in step S250, and the updated gain in step S260 updates more slowly and smoothly, thereby preventing a large amount of computations from resulting an unstable system or from unnecessarily increasing the system load.

Figure 3:
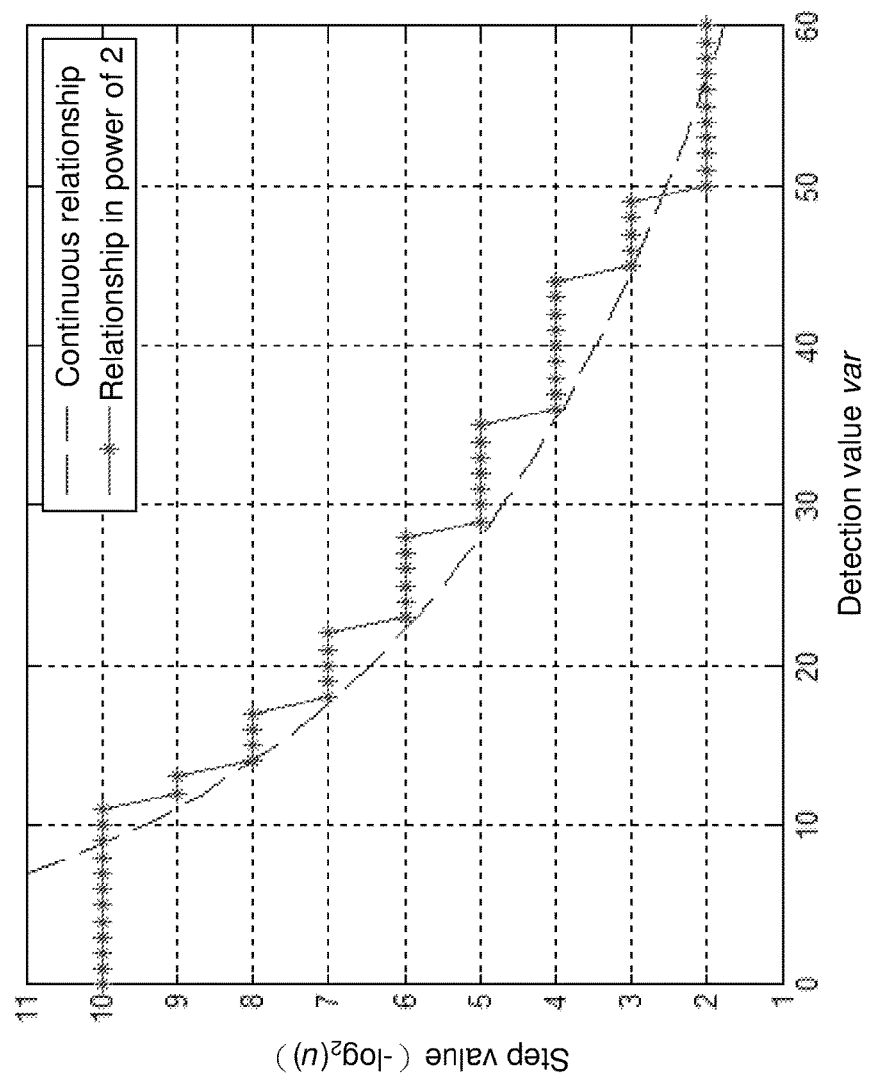
FIG. 3 is a relationship diagram of a step size u and a detection value var according to an embodiment of the present invention.

FIG. 3 shows a relationship between a step value u and a detection value var according to an embodiment of the present invention. In circuit applications, values are often expressed in an approximation of a power of 2 to reduce complexities, and so the vertical axis in the diagram is expressed in 2 raised to a negative power after the step value u approximates a power of 2. As seen from the diagram, the step value u corresponding to a smaller ACI (e.g., when the detection value var is between 10 and 15) is between $2^{-9}$ and $2^{-9}$, and the step value u corresponding to a larger ACI (e.g., when the detection value var is between 45 and 55) is between $2^{-3}$ and $2^{-2}$. The dotted lines in the diagram represent a corresponding relationship without approximation for further comparison.

One person skilled in the art may understand implementation details and variations of the method in FIG. 2 based on the disclosure of the device in FIG. 1. While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal receiving end of a digital television, comprising:
   an analog-to-digital converter (ADC), converting an input signal from an analog format to a digital format, the input signal comprising a target signal and an interference signal;
   a digital gain control circuit, coupled to the ADC, adjusting an amplitude of the target signal according to a gain;
   a detecting module, coupled to the digital gain control circuit, detecting a variance of the gain to generate a detection value; and
   a control circuit, coupled to the digital gain control circuit, determining a gain setting parameter according to the detection value;
   wherein, the digital gain control circuit further updates the gain according to the gain setting parameter, the gain setting parameter has a greater absolute value when the detection value is larger, and the gain setting parameter has a smaller absolute value when the detection value is smaller.

2. The signal receiving end according to claim 1, further comprising:
   a filter, coupled between the ADC and the digital gain control circuit, filtering out the interference signal to generate the target signal.

3. The signal receiving end according to claim 2, wherein the interference signal is an adjacent channel interference (ACI) signal of the target signal, and the filter is one of a band-pass filter, a high-pass filter and a low-pass filter.

4. The signal receiving end according to claim 1, wherein the detection value is associated with a change in the ACI.

5. The signal receiving end according to claim 1, wherein the detecting module is a function module of the control circuit and is formed by a program code, and the control circuit executes the program code to generate the detection value.

6. The signal receiving end according to claim 1, wherein the digital gain control circuit updates the gain further according to the amplitude.

7. The signal receiving end according to claim 1, wherein the digital gain control circuit updates the gain further according to a difference between the adjusted target signal and an ideal value.

8. A signal processing method for a digital television receiving end, comprising:
   converting an input signal from an analog format to a digital format, the input signal comprising a target signal and an interference signal;
   adjusting an amplitude of the target signal according to a gain;
   detecting a variance of the gain to generate a detection value;
   determining a gain setting parameter according to the detection value, comprising:
      determining the gain setting parameter to have a greater absolute value when the detection value is larger; and
      determining the gain setting parameter to have a smaller absolute value when the detection value is smaller; and
   updating the gain according to the gain setting parameter.

9. The signal processing method according to claim 8, further comprising:
  filtering the input signal to filter out the interference signal to generate the target signal.

10. The signal processing method according to claim 8, wherein the detection value is associated with a change in the ACI.

11. The signal processing method according to claim 8, further comprising:
  updating the gain according to the amplitude.

12. The signal processing method according to claim 8, further comprising:
  updating the gain according to a difference between the adjusted target signal and an ideal value.

13. A signal processing method for a digital television receiving end, comprising:
  converting an input signal from an analog format to a digital format, the input signal comprising a target signal and an interference signal;
  adjusting an amplitude of the target signal according to a gain;
  detecting a variance of the gain to generate a detection value;
  determining a gain setting parameter according to the detection value; and
  updating the gain according to the gain setting parameter and amplitude, comprising:
    determining the gain to have a greater absolute value when the amplitude is larger; and
    determining the gain to have a smaller absolute value when the amplitude is smaller.

14. A signal processing method for a digital television receiving end, comprising:
  converting an input signal from an analog format to a digital format, the input signal comprising a target signal and an interference signal;
  adjusting an amplitude of the target signal according to a gain;
  detecting a variance of the gain to generate a detection value;
  determining a gain setting parameter according to the detection value; and
  updating the gain according to the gain setting parameter and a difference between the adjusted target signal and an ideal value, comprises:
    updating the gain to have a greater absolute value when the difference is larger; and
    updating the gain to have a smaller absolute value when the difference is smaller.

* * * * *